(12) United States Patent
Elian

(10) Patent No.: US 7,125,653 B2
(45) Date of Patent: Oct. 24, 2006

(54) METHOD OF PRODUCING CONDUCTIVE OR SEMICONDUCTING STRUCTURED POLYMERS

(75) Inventor: Klaus Elian, Erlangen (DE)

(73) Assignee: Infineon Technologies AG, Munich (DE)

( * ) Notice: Subject to any disclaimer, the term of this patent is extended or adjusted under 35 U.S.C. 154(b) by 28 days.

(21) Appl. No.: 10/191,995

(22) Filed: Jul. 9, 2002

(65) Prior Publication Data

US 2003/0027079 A1    Feb. 6, 2003

(30) Foreign Application Priority Data

Jul. 9, 2001    (DE) ................. 101 33 256

(51) Int. Cl.
*G03F 7/00*    (2006.01)

(52) U.S. Cl. ...................... 430/315; 430/313

(58) Field of Classification Search ............... 430/311, 430/296, 945, 270.1, 313, 315
See application file for complete search history.

(56) References Cited

U.S. PATENT DOCUMENTS

| | | | | |
|---|---|---|---|---|
| 4,680,236 A | * | 7/1987 | Myers et al. ............... | 428/515 |
| 5,198,153 A | * | 3/1993 | Angelopoulos et al. ..... | 252/500 |
| 5,234,793 A | | 8/1993 | Sebald et al. | |
| 5,252,430 A | * | 10/1993 | Hashimoto et al. ......... | 430/296 |
| 5,384,220 A | | 1/1995 | Sezi et al. | |
| 5,629,135 A | * | 5/1997 | Kobayashi et al. ...... | 430/270.1 |
| 5,776,659 A | * | 7/1998 | Watanabe et al. ........... | 430/296 |
| 5,977,241 A | * | 11/1999 | Koloski et al. ............. | 524/502 |
| 6,379,869 B1 | * | 4/2002 | Schroeder et al. .......... | 430/313 |

FOREIGN PATENT DOCUMENTS

| | | |
|---|---|---|
| EP | 0 395 917 A2 | 11/1990 |
| EP | 0 955 562 A1 | 11/1999 |
| EP | 1 045 291 A2 | 10/2000 |
| JP | 02 273 926 A | 11/1990 |

OTHER PUBLICATIONS

E. Reichmanis et al.: "Chemically Amplified Resists: Chemistry and Processes", *Advanced Materials For Optics And Electronics*, vol. 4, 1994, pp. 83-93.

Hiroshi Ito: "Deep-UV resists: Evolution and status", *Solid State Technology*, Jul. 1996, pp. 164-170, 173.

Dago de Leeuw: "Plastic electronics", *Physics World*, Mar. 1999, pp. 31-34.

* cited by examiner

*Primary Examiner*—Kathleen Duda
(74) *Attorney, Agent, or Firm*—Laurence A. Greenberg; Werner H. Stemer; Ralph E. Locher

(57) ABSTRACT

A photoresist layer is applied to the surface of a substrate. The photoresist layer is exposed and then developed, to form a structured polymer. A solution is then applied to the structured polymer that contains at least one organic electrically conductive compound. The structured polymer is converted into a conducting or semiconducting structured polymer.

18 Claims, 2 Drawing Sheets

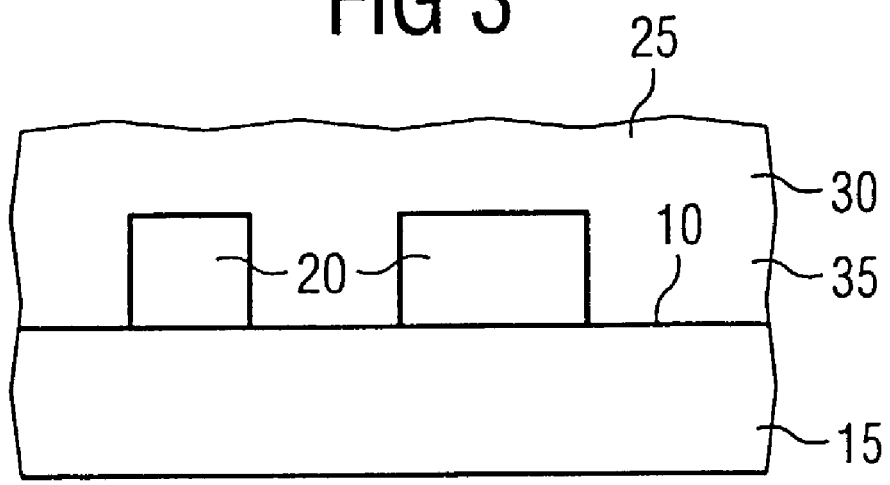
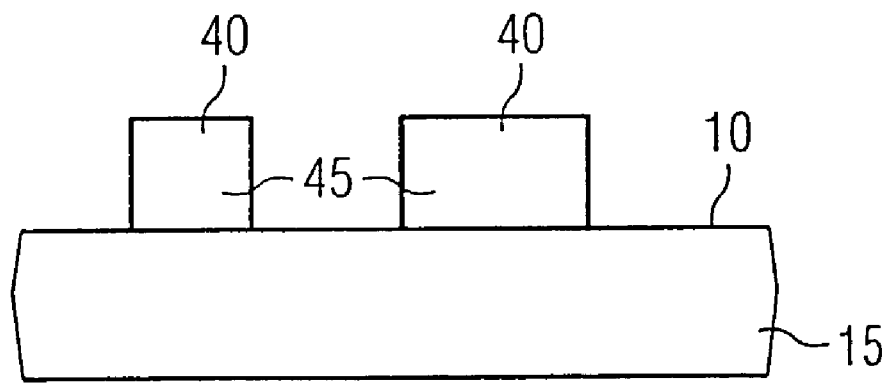

METHOD OF PRODUCING CONDUCTIVE OR SEMICONDUCTING STRUCTURED POLYMERS

BACKGROUND OF THE INVENTION

1. Field of the Invention

The present invention relates to a process for preparing conductive or semiconducting structured polymers.

In microelectronics, photoresists are widely used for a variety of lithographic technologies. Normally, a photoresist layer is applied to a substrate that is to be structured (or patterned) and subsequently exposed. Following the exposure, the photoresist layer is developed so that, depending on whether it is a positive or a negative resist, the exposed portions of the photoresist layer are removed by the developer or the unexposed portions of the photoresist are removed by the developer.

Thereafter, the structured photoresist layer is used as an etch mask for the etching of the substrate. In this procedure, the structure of the structured photoresist layer is transferred into the substrate. Normally, the photoresist layer is then removed from the substrate. Accordingly, the photoresist layer is an auxiliary layer which is used for structuring the substrate and then removed again. Customary photoresist layers are nonconducting, thereby preventing short circuits due to incompletely removed photoresist residues.

The prior art has disclosed, for example, what are known as chemically amplified resists (CARs) for lithographic technologies and processes. The CAR photoresists can be used in accordance with the principle of acid-catalytic cleavage. In accordance with this principle, in the case of positive-working photoresists, a polar carboxylic acid group is formed from an apolar chemical group, such as a tert-butyl carboxylate group, for example, in the presence of a photolytically generated acid. In a subsequent developing step, the exposed photoresist layer is treated with aqueous-alkaline developer solutions, with the polar regions rich in carboxylic acid being dissolved and the unexposed regions of the resist remaining. Reference is had, in this context, to the description in Solid State Technology, Vol. 39 (1996), No.7, pages 164–173.

In a process known from European patent document EP 0 395 917 for the subsequent processing of photoresist structures which have already been developed, a special kind of photoresist system developable by aqueous alkali is used. In this case, a base polymer is used in the resist that contains further reactive groups. The groups allow the developed resist structure to be aftertreated with appropriate reagents. In the course of the aftertreatment, the structures are widened (chemical amplification of resist lines: CARL) and the resist trenches and resist holes narrowed, leading among other things to an enlargement of the processing window during production.

In accordance with a process known from U.S. Pat. No. 5,234,793, the aftertreatment is utilized for silylation in a two-layer resist system (SI-CARL).

Chemically amplified photoresists are also known from Advanced Materials for Optics and Electronics, Vol. 4 (1994), pages 83–93.

The purpose of the abovementioned photoresists is to serve as etch masks for structuring a substrate, and then to be removed.

Organic semiconductors and electronic components based on polymer electronics offer an attractive alternative to conventional inorganic components. The reason for this attractiveness lies, for example, in low production costs, simple packing, and compatibility with flexible substrates. By way of example, organic p-semiconductors are already known from Römpp, Lexikon der Chemie, Thieme-Verlag. Examples of organic p-semiconductors are polypyrrole, poly (phenylene-vinylene) or doped polyacetylene.

In their original chemical form, semiconducting and conducting polymers are very difficult to process owing to their conjugated double bond structure. Because of the rigid polymer structure caused by the double bonds, these polymers are in particular often of sparing to zero solubility even in suitable process solvents. Increasing the solubility and hence enhancing the processability needed for producing a film having a certain minimum thickness requires complex chemical modifications of the conductive organic polymer molecules. By means of suitable chemical modification of the semiconducting or conducting organic starting substances it is possible to increase the solubility, at least to some extent. This is described, for example, in Physics World, March 1999, pages 31–34. In this case the solubility can be increased by attaching suitable flexible, long sidechains. To do so, however, requires considerable synthesis effort, since it is necessary to retain the conductivity of the molecules during chemical modification, thereby increasing the costs.

SUMMARY OF THE INVENTION

It is accordingly an object of the invention to provide a method for the preparation of conductive or semiconducting structured polymers, which overcomes the above-mentioned disadvantages of the heretofore-known devices and methods of this general type.

With the foregoing and other objects in view there is provided, in accordance with the invention, a method for preparing a structured conductive or semiconducting polymer. The method comprises the following steps:

a) providing a substrate;

b) applying a photoresist layer to the substrate;

c) exposing and then developing the photoresist layer to produce a structured polymer;

d) applying a solution comprising at least one organic, electrically conductive compound to the structured polymer (20), the structured polymer being made electrically conductive.

Through the process of the invention, the functions needed for an electronic circuit are first of all structured into a customary photoresist layer. This has the advantage that existing methods and known materials having known properties can be used here in order to produce the structures in the photoresist layer. Nor is it necessary to bear in mind any possible influence or even destruction of the electrical properties of a polymer which is disposed in the photoresist layer, since at this point in time no conductive polymers are yet necessary in the photoresist layer. Consequently, it is also impossible to destroy the electrical properties of an electronic component at this stage of the process. After structuring of the photoresist layer is complete, the structures produced in the photoresist layer are chemically modified and so acquire the desired conducting or semiconducting properties. This is achieved by applying a solution comprising at least one organic, electrically conductive compound to the already structured polymeric structure.

This electrically conductive compound is selected from electrically conductive polymers, semiconducting polymers, and conductive organic compounds of low molecular mass. It is possible for the structured polymer formed from the photoresist layer to be modified chemically only on the surface or in its interior as well.

As conductive compounds for the purposes of the invention it is also possible to use what are known as intrinsic electrically conductive compounds, e.g., polymers such as polythiophene or polypyrrole and compounds of low molecular mass such as anthracene. These compounds generally have an extended $\pi$ electron system, with electrically conductive compounds being formed only by doping by way of oxidation or reduction reactions, e.g., with Fe(III) chloride.

The electrically conductive compound is further selected from the group:

polypyrrole, polythiophene, polyaniline, anthracene, terthiophene, and aniline.

In accordance with an advantageous feature of the invention, the photoresist layer and the conductive compound contain functional groups which are able to react with one another, the conductive compound then being especially effectively covalently coupled to the structured polymer in step D) of the process. For example, the photoresist layer may contain acid anhydride groups and the conductive compound amino groups, so that amides are formed. As conductive compounds it is possible in that case to use, for example, aminopolypyrrole, aminopolythiophene, aminopolyaniline, aminoanthracene, aminoterthiophene, and aminoaniline.

In the process of the invention as well, the conducting or semiconducting compounds are required to be soluble. In this case, however, the degree of solubility required is much less than would be needed for a conductive polymer dissolved directly in a solution, in order for a conductive polymeric layer of sufficient thickness to be formed subsequently on a substrate from the dissolved polymer. This represents a considerable improvement over the prior art processes.

Another embodiment of the process of the invention envisages using a photoresist layer comprising a polymer which as a result of the action with an acid undergoes a change in its solubility.

A further advantageous embodiment of the process of the invention envisages generating an acid in step C) of the process by irradiating a photoreactive compound which is present in the photoresist layer with light, X-rays, electrons or ions. On exposure to light, for example, the photoreactive compound may break down into a very strong sulfonic acid and byproducts. In a subsequent heating step, the acid formed acts as a catalyst for the modification of the polymer from apolar to polar, thus resulting in a change in the solubility of the exposed polymer.

In accordance with an additional feature of the invention, the photoresist layer comprises a solvent.

In accordance with a further embodiment of the novel process a photoresist layer is used which comprises one or more additives. Additives may, for example, be slightly basic compounds. These influence the diffusion and hence the mode of action of the photoacid generated beforehand (e.g., sulfonic acid). As a result, it is possible to enhance the quality of the resist structures produced, in terms of edge angle, profile, and resolving power. Other possible additives are sensitizers, which improve the quantum yield of the photochemical reaction (e.g., acid generation).

A further embodiment of the process uses a photoresist layer containing one of the following acid-labile groups: tert-alkyl ester or tert-butoxycarbonyloxy or acetal or tetrahydrofuranyl or tetrahydropyranyl. These groups are initially apolar and are able to react with the acid formed on exposure to form polar groups. As a result, the photoresist becomes structurable.

Yet a further embodiment of the process provides for the liberation of sulfonic acid from the photoreactive compound of the photoresist layer as an acid generator. An advantage here is that sulfonic acid is a strong acid which is particularly well able to react with the above-mentioned apolar groups. It is advantageous in this context that in the case of a lithography process very short exposure times are sufficient, allowing a high production throughput.

A further advantageous embodiment of the process of the invention envisages the photoreactive compound being selectable from the following compounds: dialkyl-iodonium salt, alkylaryliodonium salt, diaryliodonium salt, trialkylsulfonium salt, dialkylarylsulfonium salt, alkyldiarylsulfonium salt, triarylsulfonium salt in each case of a sulfonate, o-nitrobenzylsulfonate, salt of a benzylthiolanium compound, and a salt of a monofluorinated or polyfluorinated butanesulfonate. As alternatives it is likewise possible to use N-sulfonic esters.

Preferred examples include triphenylsulfonium hexafluoropropanesulfonate and N-sulfonic esters.

In accordance with again another feature of the invention, the photoresist layer in step c) of the process is irradiated with light having a wavelength of between 1 nm and 1000 nm. This has the advantage that conventional light wavelengths used for structuring photoresists can still be used.

Another advantageous process step provides for the solution comprising an amino-containing and electrically conductive compound or an amino-containing and semiconducting compound in a solvent which is appropriately suitable. A high level of reactivity of the compound with the polymer's own anhydride is advantageous in this case. Examples of suitable solvents for the organic conductive compound include water, isopropanol, ethanol, methoxypropyl acetate, ethyl acetate, ethyl lactate, gamma-butyrolactone, and their possible optional mixtures.

In accordance with a concomitant feature of the invention, the semiconducting or conducting structured polymer is washed, following step d) of the process, with a solvent, which removes the residues of the solution and leaves the conducting or semiconducting structured polymer on the substrate surface. This has the advantage that the solution used in order to convert the structured polymer can be removed after the conducting or semiconducting structured polymer has been formed.

Other features which are considered as characteristic for the invention are set forth in the appended claims.

Although the invention is illustrated and described herein as embodied in a method of producing conductive or semiconducting structured polymers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a partial side view of the substrate with an applied solution; and

FIG. 4 is a partial side view of the substrate with semi-conducting or conducting structured polymers.

DESCRIPTION OF THE PREFERRED EMBODIMENTS

Figure 1:
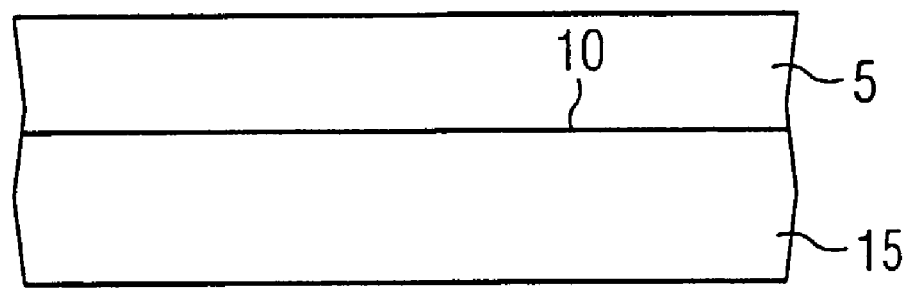
FIG. 1 is a partial side view of a substrate with a photoresist layer.

Referring now to the figures of the drawing in detail and first, particularly, to FIG. 1 thereof, there is shown a substrate 15 with a substrate surface 10. A photoresist layer 5 is disposed on the substrate surface 10. The photoresist layer 5 is applied to the substrate 15 by means, for example, of spincoating. The photoresist layer 5 comprises, for example, a chemically amplified resist which by way of example comprises the following components:

- a polymer in which the action of acid causes a change in solubility, and in which there are carboxylic anhydride groups, and also
- a photoreactive compound which on exposure to light or X-rays or electrons or ions produces an acid (photoacid generator), and
- a solvent and also, where appropriate, one or more additives.

In a further step of the process the photoresist layer is dried. Afterward, the photoresist layer 5 is exposed by means of light or X-rays or electron beams or ion beams. Following exposure, the photoresist layer 5 is heated where appropriate.

Heating makes possible the reaction of the photolytically generated sulfonic acid with the acid-labile apolar groups of the polymer. Customary temperatures are in the range from 60° C. to 200° C. for a period of between 30 and 600 seconds.

During the heating step, photolytically generated sulfonic acid in the polymer cleaves acid-labile groups and so brings about a change in polarity and hence a change in the solubility behavior of the polymer, which ultimately makes the difference between developable and undevelopable.

Figure 2:
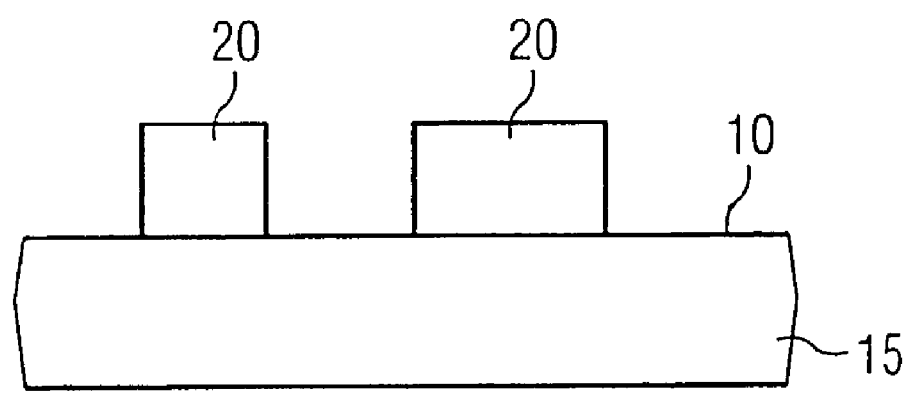
FIG. 2 is a partial side view of the substrate with a structured photoresist layer.

With reference to FIG. 2, the photoresist layer 5 is subsequently developed using an aqueous-alkaline developer solution, with the exposed or unexposed portions of the photoresist layer 5 dissolving in the developer solution depending on whether it is a positive or negative resist. Structured polymers 20 are thereby formed on the surface 10 of the substrate 15.

Referring to FIG. 3, a solution 25 is then applied to the substrate surface and to the structured polymers 20. The solution 25 contains, for example, suitable electrically conductive polymers 30 or suitable semiconducting polymers 35 or organic compounds of low molecular mass. These organic conductive compounds modify the structured polymer 20 chemically, so that a conducting polymer 40 or a semiconducting structured polymer 45 is formed. This is illustrated, for example, in FIG. 4.

In the case of this chemical modification, the maleic anhydride that is present in the structured polymer can react with a conductive compound represented by an amino-containing polyaniline. A suitable solvent in this case is a 1:1 mixture of water and isopropanol. The polyaniline is attached covalently to the resist polymer by way of an amide bond.

Thereafter, the substrate surface and the conducting structured polymer 40 or the semiconducting structured polymer 45 are washed and dried.

By means of the chemical reaction of the photoresist layer 5 with the conductive compounds it is particularly easy for a polymer electronic circuit to be formed. An advantage here is that the process sequence for producing a semiconducting or conducting structured polymer is made much easier. Another advantage is that highly diluted reaction solutions 25 of the organic conductive compounds can be used, so that the low solubility of these compounds is sufficient in the present production process. Moreover, as a result of the process of the invention, it is possible to avoid a very cost-intensive synthesis for preparing compounds of improved solubility.

The base polymer of the photoresist layer 5 contains appropriate chemical functionalities which are suitable for the attachment of further molecules. An example of a suitable base polymer is a CARL photoresist. However, this resist has conventionally been used only in the context of the above-mentioned silylation reaction. The invention further provides, as part of the appropriate process, using the resist material not only for structure definition but also, furthermore, through further process steps, as a base substance for the semiconducting or conducting structured polymers.

EXAMPLE

Preparation of the Base Polymer

A mixture of 35.8 g (0.365 mol) of maleic anhydride and 0.6 g (3.65 mmol) of azoisobutyronitrile (AIBN) as free-radical initiator in 180 ml of ethyl acetate is charged to a three-necked flask and this initial charge is heated to boiling. A mixture of 4.7 g (0.055 mol) methacrylic acid and 44.02 g (0.31 mol) of tert-butyl methacrylate is added dropwise over the course of 1 h. After further boiling for 30 minutes, the mixture is cooled to room temperature overnight. Over the course of 3.5 h it is added dropwise to 3 l of a mixture of petroleum spirit (60–80° C.)/isopropanol (3:2), the polymer forming a colorless precipitate. Following isolation on a frit, washing is carried out with twice 250 ml of a petroleum spirit/isopropanol mixture (3:2) and once with 250 ml of petroleum spirit. After the terpolymer P1 has been dried initially over $CaCl_2$ in a vacuum desiccator, it is dried at 40° C. in a vacuum drying cabinet for 4 days. Yield: approximately 65% of theoretical yield.

Preparation of the Photoresist and Application to Substrate

A resist is prepared, consisting of 8.57 g of the terpolymer P1 prepared above, 0.42 g of triphenylsulfonium tetrafluoromethanesulfonate as photoacid generator, and 30 g of 1-methoxy-2-propyl acetate as solvent. The resist thus prepared is applied by spincoating at a rotary speed of 1500/min to a silicon wafer for 20 s and then dried on a hotplate at 120° C. for 60 s. The layer thickness of the resist is then 1.7 µm.

Structuring of the Photoresist

The resist is then written using an electron beam writer (Jeol JSM 840A/Sietec nanobeam) at an acceleration voltage of 30 kV and then baked on the hotplate at 120° C. for 120 s. The tert-butyl ester, under catalysis by the acid generated as a result of the electron beam irradiation, is cleaved and the structure written is obtained by dip development (60 s) using TMA238WA (JSR Electronics).

Chemical Modification of the Structured Photoresist

The structure thus developed is subsequently immersed in a solution of 2% 2-aminoanthracene in hexanol for 20 s, after which the wafer is rinsed with isopropanol for 5 s and blown dry using compressed air. The wafer is heat-treated on a hotplate at 120° C. for 120 s. It is then immersed for one second in a 3% solution of iron(III) chloride in acetonitrile and subsequently rinsed again with isopropanol for 5 s, blown dry using compressed air, and again dried on a hotplate at 90° C. for 30 s. This produces regular line/trench structures varying in width between 0.5 µm and 2 µm.

I claim:

1. A method of producing a structured conductive polymer, which comprises the following method steps:
   a) providing a substrate;
   b) applying a photoresist layer to the substrate;
   c) exposing and developing the photoresist layer to produce a structured polymer;
   d) applying a solution containing at least one organic, intrinsic electrically conductive compound to the structured polymer for chemically modifying the structured polymer; and
   e) additionally in a further step rendering the structured polymer electrically conductive only on its surface or also in its interior.

2. The method according to claim 1, wherein step d) comprises applying a solution of an organic electrically conductive compound selected from the group of compounds consisting of electrically conductive polymers, semiconducting polymers, and electrically conductive compounds of low molecular mass.

3. The method according to claim 1, which comprises, following the application of the solution, rendering the structured polymer conductive by oxidizing or reducing the electrically conductive compound.

4. The method according to claim 1, wherein the organic electrically conductive compound is selected from the group consisting of polypyrrole, polythiophene, polyaniline, anthracene, terthiophene, and aniline.

5. The method according to claim 1, which comprises using a photoresist layer and an electrically conductive compound that contain functional groups enabled to react with one another, wherein the electrically conductive compound is coupled to the structured polymer in step d).

6. The method according to claim 1, wherein the photoresist layer contains acid anhydride groups and the electrically conductive compound contains amino groups.

7. The method according to claim 1, wherein the photoresist layer comprises a polymer that, upon exposure to an acid, undergoes a change in a solubility thereof.

8. The method according to claim 1, wherein step c) comprises generating an acid by irradiating a photoreactive compound present in the photoresist layer with exposure radiation selected from the group consisting of light, X-rays, electrons, and ions.

9. The method according to claim 8, wherein sulfonic acid is liberated from the photoreactive compound of the photoresist layer.

10. The method according to claim 8, wherein the photoreactive compound comprises at least one compound selected from the group consisting of dialkyliodonium salt, alkylaryliodonium salt, diaryliodonium salt, trialkyJ-sulfonium salt, dialkyJ, arylsulfonium salt, alkyldiarylsulfonium salt, triarylsulfonium salt in each case of a sulfonate, o-nitrobenzylsulfonate, salt of a benzylthiolanium compound, and a salt of a monofluorinated or polyfluorinated butanesulfonate.

11. The method according to claim 1, wherein the photoresist layer comprises one or more additives.

12. The method according to claim 1, wherein the photoresist layer comprises one of the following acid-forming groups: tert-alkyl ester or tert-butoxycarbonyloxy or acetal or tetrahydrofuranyl or tetrahydropyranyl.

13. The method according to claim 1, wherein step c) comprises irradiating the photoresist layer with light having a wavelength of between mm and 1000nm.

14. The method according to claim 1, which comprises, subsequently to step d), washing the conducting structured polymer or the semiconducting structured polymer with a solvent for removing residues of the solution and leaving the conducting or semiconducting structured polymer on the substrate.

15. A method of producing a structured conductive or semiconducting polymer, which comprises the following method steps:
   a) providing a substrate;
   b) applying an electrically insulating photoresist layer to the substrate;
   c) exposing and developing the photoresist layer to produce a structured polymer;
   d) applying a solution containing an organic intrinsic semiconducting or conducting compound to the structured polymer, the organic intrinsic semiconducting or conducting compound chemically reacting with the structured polymer; and
   e) additionally in a further step rendering the structured polymer semiconducting or electrically conductive only on its surface or also in its interior.

16. A method of producing a structured conductive or semiconducting polymer, which comprises the following method steps:
   a) providing a substrate;
   b) applying a photoresist layer to the substrate;
   c) exposing and developing the photoresist layer to produce a structured polymer;
   d) applying a solution containing at least one organic, intrinsic electrically conductive or semiconducting compound to the structured polymer for chemically modifying the structured polymer on its surface; and
   e) additionally in a further step rendering the surface of the structured polymer electrically conductive or semiconducting.

17. A method of producing a structured conductive or semiconducting polymer, which comprises the following method steps:
   a) providing a substrate;
   b) applying a photoresist layer to the substrate;
   c) exposing and developing the photoresist layer to produce a structured polymer;
   d) applying a solution containing at least one organic, intrinsic electrically conductive or semiconducting compound to the structured polymer for chemically modifying the structured polymer on its surface and in its interior; and
   e) additionally in a further step rendering the surface and the interior of the structured polymer electrically conductive or semiconducting.

18. A method of producing a structured conductive polymer, which comprises the following method steps:
   a) providing a substrate;
   b) applying a photoresist layer to the substrate;

c) exposing and developing the photoresist layer to produce a structured polymer;

d) applying a solution containing at least one intrinsic electrically conductive compound to the structured polymer for chemically modifying the structured polymer; and e) additionally in a further step rendering the structured polymer electrically conductive only on its surface or also in its interior by oxidizing or reducing the intrinsic electrically conductive compound.

* * * * *

UNITED STATES PATENT AND TRADEMARK OFFICE
CERTIFICATE OF CORRECTION

PATENT NO. : 7,125,653 B2
APPLICATION NO. : 10/191995
DATED : October 24, 2006
INVENTOR(S) : Klaus Elian It is certified that error appears in the above-identified patent and that said Letters Patent is hereby corrected as shown below:

<u>Column 7,</u>

Lines 65-66, "trialkyJ-sulfonium salt, dialkyJ, arylsulfonium salt" should read

-- trialkylsulfonium salt, dialkylarylsulfonium salt --

<u>Column 8,</u>

Line 12, "between mm and 1000nm." should read -- between 1nm and 1000nm.--

Signed and Sealed this

Thirtieth Day of January, 2007

JON W. DUDAS
*Director of the United States Patent and Trademark Office*